United States Patent [19]
Yeom

[11] Patent Number: 5,936,890
[45] Date of Patent: Aug. 10, 1999

[54] SEMICONDUCTOR FLASH MEMORY HAVING PAGE BUFFER FOR VERIFYING PROGRAMMED MEMORY CELLS

[75] Inventor: Jin Seon Yeom, Suwon, Rep. of Korea

[73] Assignee: Samsung Electronics Co., Ltd., Rep. of Korea

[21] Appl. No.: 09/122,555

[22] Filed: Jul. 24, 1998

[30] Foreign Application Priority Data

Jul. 29, 1997 [KR] Rep. of Korea ...... 97-35820

[51] Int. Cl.⁶ ............... G11C 16/06
[52] U.S. Cl. ............... 365/185.22; 365/185.12; 365/185.17
[58] Field of Search ............... 365/185.22, 185.12, 365/185.17

[56] References Cited

U.S. PATENT DOCUMENTS 5,550,842  8/1996  Tran ........................ 365/185.22
5,581,504  12/1996  Chang ...................... 365/185.17
5,677,556  10/1997  Endoh ...................... 257/316

OTHER PUBLICATIONS

Suh, Kang–Deog et al., "A 3.3V 32 Mb NAND Flash Memory with Incremental Step Pulse Programming Scheme," IEEE International Solid–State Circuits Conference, 1995, pp. 128–129.

Primary Examiner—Andrew Q. Tran
Attorney, Agent, or Firm—Lappin & Kusmer LLP

[57] ABSTRACT

A semiconductor memory includes a plurality of memory cells being electrically programmed and coupled to word lines and bit lines. A first latch circuit holds data during a programming operation including a verifying step. A second latch circuit generates a result from verifying a programmed memory cell, in response to the data held in the first latch circuit.

8 Claims, 8 Drawing Sheets

SEMICONDUCTOR FLASH MEMORY HAVING PAGE BUFFER FOR VERIFYING PROGRAMMED MEMORY CELLS

FIELD OF THE INVENTION

The invention is in the field of memories and is more specifically related to memories employing electrically erasable and programmable read-only-memory cells (EEPROM cells).

BACKGROUND OF THE INVENTION

There is an increasing demand for semiconductor memories that can be electrically erased and programmed without the need for refreshing data stored in the memory. Also, there is a trend toward enhancing the storage capacity and the density of integration in memory devices. NAND-type flash memory is one example of a nonvolatile semiconductor memory that provides high capacity and integration density without the need for refreshing stored data.

FIG. 1 contains a block diagram of an array of memory cells and page buffers assigned to the array in a NAND-type flash memory. The memory includes a cell array 10, row decoder 20, page buffer group 30 and Y-pass gate circuit 40. Cell array 10 is formed of a plurality of strings 12 (a "string" is a cell unit corresponding to one bit of data) arranged in columns. Each string includes a string selection transistor SSTm (m=0,1,2, . . . ,I), the gate of which is coupled to a string selection line SSL. Each string also includes a ground selection transistor GSTm (m=0,1,2, . . . ,I), the gate of which is coupled to a ground selection line GSL. Memory cells MCj are connected in series between each string selection transistor SSTm and its associated ground selection transistor GSTm. Control gates of the memory cells are coupled to word lines WLj. The drain of each string selection transistor SSTm is connected to its corresponding bit line BLm, and the source of each ground selection transistor GSTm is connected to a common source line CSL. Outputs of row decoder 20 are connected to SSL, CSL and word lines WL0–WLm.

The page buffer group 30 includes page buffers 30_m corresponding to the bit lines BLi. During a read cycle, a page buffer senses data from a selected memory cell and then transfers the data to a data output buffer through Y-pass gate circuit 40. During a write cycle, a page buffer stores data applied from a data input buffer through Y-pass gate circuit 40. Hereinafter, even page buffer 30_0, corresponding to bit line BL0, is referred to in describing the read and write operations. Other page buffers 30_1–30_i, corresponding to other bit lines BL1–BLi, have the same constructions and functions as those of the 30_0.

Page buffer 30_0 includes PMOS transistor M2, six NMOS transistors M1 and M3–M7, a latch 50 formed of inverters IV1 and IV2, and tri-state inverter IV3. NMOS transistor M1, the gate of which is coupled to signal BLSHF, is connected between node N1 and bit line BL0 to adjust a voltage level of BL0 which is developed while being activated and to prevent page buffer 30_0 from being influenced by a high voltage when the high voltage is applied to BL0. The gate and source of PMOS transistor M2, whose drain is connected to node N1 (the drain of M1), are connected to a signal CURMIR and a power source voltage Vcc, respectively. PMOS transistor M2 supplies current to BL0 in response to signal CURMIR. NMOS transistor M3, the source and gate of which are connected to ground Vss and signal DCB, respectively, is connected between node N1 and Vss and discharges a voltage of BL0 and resets the page buffer to a ground level. NMOS transistor M4, the gate of which is coupled to signal SBL, is connected between node N2 of latch 50 and node N1. The drain of M4 is connected to Y-pass gate circuit 40 through tri-state inverter IV3, the state of which is controlled by signals Osac and OsacB (the complement of Osac). Data to be programmed is transferred to node N2 of latch 50 through NMOS transistor M7, the gate of which is coupled to signal SPB. Node N3 (a complimentary node of N2) of latch 50 is connected to Vss through NMOS transistor M5, whose gate is coupled to node N1, and NMOS transistor M6, whose gate is coupled to signal Olatch. NMOS transistors M5 and M6 change a state of data stored in the latch in response to a voltage level on bit line BL0.

FIG. 2 contains a flow chart illustrating the logical flow of a programming operation in a memory. As shown in FIG. 2, before programming, data to be written is supplied to latch 50 and stored therein [S10]. Thus, latch 50 of page buffer 30_0 (FIG. 1) is set to the ground potential while another latch corresponding to a program-prohibited memory cell is held in Vcc. In the programming step [S20], after setting the latch, a program voltage (Vpgm) is applied to a selected word line while a pass voltage (Vpass) is applied to unselected word lines. Then, in a memory cell coupled to the selected word line and corresponding to the latch set in Vss, electrons are injected into its floating gate, causing a threshold voltage of the cell to be increased, such that the memory cell is programmed. Memory cells corresponding to the latch set at Vcc do not experience the injecting condition, and threshold voltages of the unselected memory cells do not change. After programming, for all of the cells, the program verifying operation [S30] starts with retrieving retrieval of data from the programmed cell. If the programming of the selected cell has been successfully completed, the holding state of the corresponding latch 50 may be changed from Vss to Vcc. If, however, there is at least one page buffer which has still held data regarded as Vss even after the verifying cycle, the former steps [S10], [S20] and [S30] are repeatedly conducted until the memory cell corresponding to the unchanged page buffer is properly programmed [S40].

FIG. 3 contains a timing diagram of signals controlling the page buffers of FIG. 1 during a programming verifying cycle, and FIG. 4 shows distribution profiles for threshold voltages of a memory cell transistor after the programming verifying cycle. With respect to the program verifying operation, referring to FIGS. 1–4, assuming that word line WL1 is selected, data "0" is loaded in the latches 50 of page buffers 30_0 and 30_1 which correspond each to BL0 and BL1, and memory cell MC1 coupled to WL1 and BL0 has been programmed with its threshold voltage about 1 V during step S20 while another memory cell MC1 coupled to WL1 and BL1 has its threshold voltage about 0.3 V after the step S20. String selection line SSL, ground selection line GSL and unselected word lines WL0 and WL2–WL15 are set to Vcc or voltages higher than Vcc while the selected word line WL1 and common source line CSL are held at 0 V, as shown in FIG. 3. Consequently, the voltage of signal BLSHF goes to a predetermined level, for instance, about 2.2 V, and signals SBL and DCB are 0 V. Signal CURMIR drops down to a predetermined voltage level. With the biasing condition with the control signals, BL0 is pulled up to about 1.5 V by NMOS transistor M1 which has a threshold voltage about 0.7 V, and BL1 is pulled down to 0 V because its corresponding memory cell has not been completely programmed as an off-cell. Therefore, node N1 of page buffer 30_0 and node N1' of page buffer 30_1 become the voltage levels of Vcc and Vss, respectively.

Thereafter, when signal Olatch goes to Vcc from 0 V, the output of the latch in page buffer 30_0, set1, is changed to Vcc from Vss by the NMOS transistors M6 and M14 responding to Olatch. The output of the latch in page buffer 30_1, set2, is still held in Vss because NMOS transistor M13, the gate of which is coupled to node N1', is turned off. Thus, since the voltage level on BL0 retains Vcc that is available to set the BL0 into a program protecting condition during the following program cycles, the memory cell assigned to BL0 can maintain the threshold voltage of 1 V without being increased even during repeated programming. Also, the memory cell under-programmed, assigned to BL1, is subjected to the following program cycles until it has the desired threshold voltage (about 1 V).

However, as the NAND-type flash memory conducts the programming operation for all of memory cells coupled to a single word line in the same time, it is virtually impossible to complete a programming operation in just a single cycle. The programming must be activated many times to program the cells. Such repeated looping increases the current passing through the memory cells, causing a voltage level on the common source line to increase. The increase of the voltage on CSL, called CSL noise, may disturb the verifying function in which an under-programmed memory cell, i.e., having a threshold voltage lower that the desired level of 1 V, could be determined to be a completely programmed cell. For example, assuming that a voltage level of CSL has been increased to about 0.7 V due to the cell current for several verifying cycles and a selected memory cell MC0 has a substantial threshold voltage of about 0.3 V at present, a detected threshold voltage of the memory cell MC0 becomes as if it is 0.7 V in a present verifying step. As a result, the output of the latch in the page buffer corresponding to the memory cell is forced to be changed to Vcc from Vss. As a result, the under-programmed cell which was considered to be a completely programmed cell, i.e., an off-cell, by the malfunction, may cause a failure for data storing in the memory device. As shown in FIG. 4, threshold voltages of some memory cells are distributed in the region lower than the criteria by which it is determined whether a memory cell is an off-cell.

SUMMARY OF THE INVENTION

Accordingly, it is an object of the invention to provide a semiconductor memory capable of conducting an efficient programming operation.

It is another object of the invention to provide a semiconductor memory capable of enhancing the reliability of program verifying function.

It is another object of the invention to provide a semiconductor memory having reliable construction for efficiently conducting programming and program verifying operations.

In order to accomplish those and other objects, a memory in accordance with the invention includes a plurality of electrically programmable memory cells coupled to word lines and bit lines of the memory. A first latch circuit holds data during a programming operation and during a programming verifying operation. A second latch circuit generates, in response to the data held in the first latch circuit, a result from verifying a programmed memory cell.

In one embodiment, the first and second latch circuits are part of a page buffer of the memory. Either or both of the latch circuits can be formed using a pair of inverter circuits.

Memory cells designated not to be programmed (prohibited cells) could be detected as under-programmed memory cells because of verifying current deposited during a program verifying step. Such disturbance can be removed by means of the first and second latch circuits in which, even having sensed the prohibited cell as an insufficiently programmed cell or a sufficiently programmed cell, the second latch circuit does not further regard the program-prohibited cell to be a programmable cell, in response to the data stored in the first latch circuit during the programming operation.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 5:
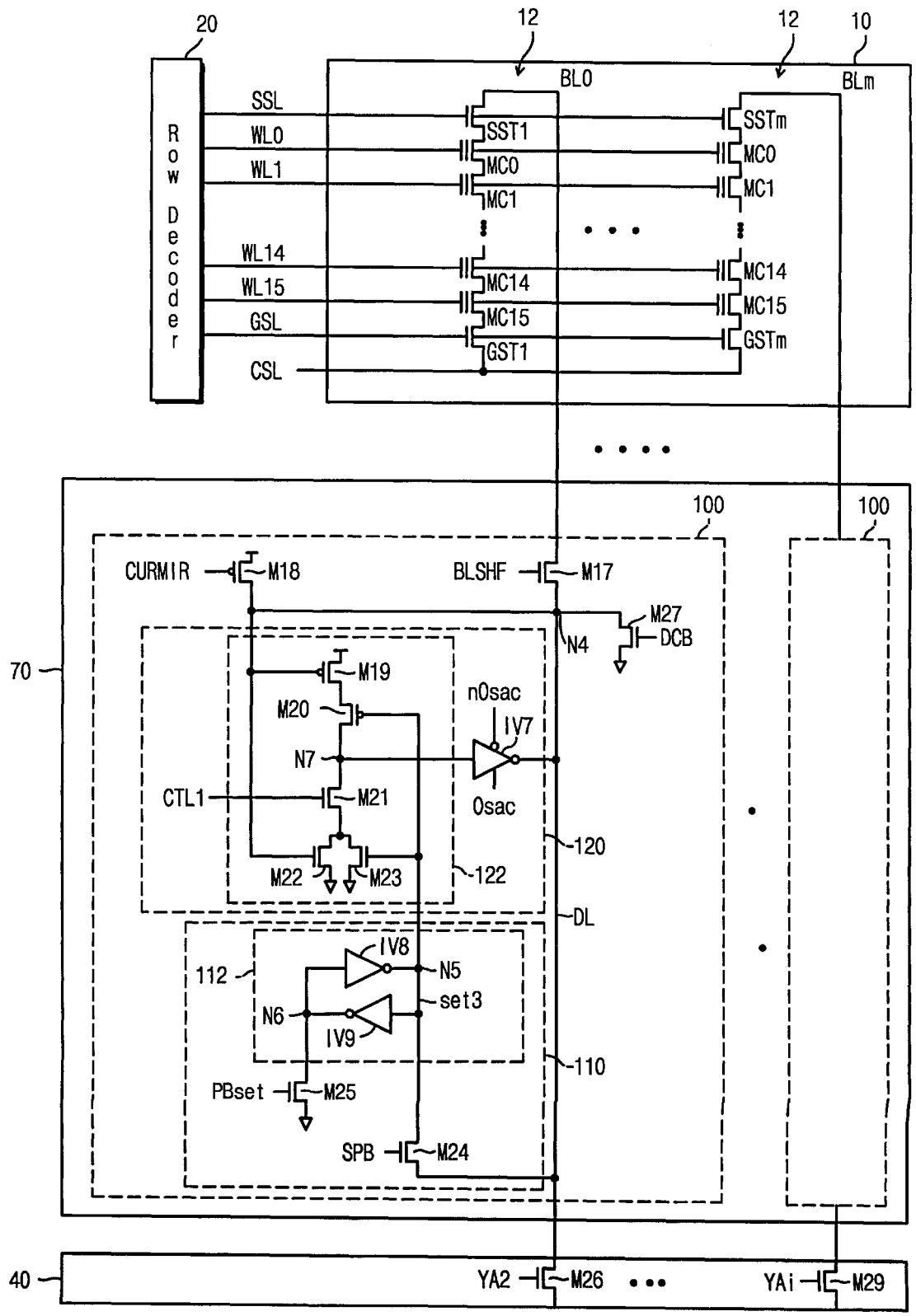
FIG. 5 contains a schematic circuit diagram illustrating construction of a memory cell array and page buffers in a NAND-type flash memory, according to the invention.

FIG. 5 contains a schematic circuit diagram of an embodiment of cell arrays and a page buffer circuit in a NAND-type flash memory in accordance with the invention. Referring to FIG. 5, the memory includes a memory cell array 10, a row decoder 20, a page buffer group 70 and a Y-pass gate circuit 40. Memory cell array 10 is formed of a plurality of strings 12 arranged in columns. Each string includes a string selection transistor SSTm (m=0,1,2, . . . , I), the gate of which is coupled to a string selection line SSL. Each string also includes a ground selection transistor GSTm (m=0,1,2, . . . , I), the gate of which is coupled to ground selection line GSL. Memory cells MCj are connected in series between a string selection transistor SSTm and a corresponding ground selection transistor GSTm, the control gates of the memory cells being coupled to word lines WLj. The drain of the string selection transistor SSTm is connected to its corresponding bit line BLm, and the source of the ground selection transistor GSTm is connected to a common source line CSL. Outputs of row decoder 20 are connected to SSL, CSL and word lines WL0-WLm, selecting one of the word lines.

The page buffer group 70 is formed of a plurality of page buffers 100 assigned to bit lines BLi in memory cell array 10. Each page buffer 100 has NMOS transistors M17 and M27, PMOS transistor M18 and first and second latch circuits 110 and 120. NMOS transistor M17, the gate of which is coupled to signal BLSHF, is connected between node N4 and bit line BL0, adjusting a voltage level of BL0 which is developed while being activated and preventing page buffer 100 from being influenced by a high voltage when the high voltage is applied to BL0. The source and gate of PMOS transistor M18, whose drain is connected to node N4 (the drain of M17), are connected to power source voltage Vcc and signal CURMIR, respectively. PMOS transistor M18 supplies steady current to BL0 in response to signal CURMIR. NMOS transistor M27, the gate of which is connected to signal DCB, is connected between node N4 and Vss and discharges a voltage of BL0 and resets the page buffer to a ground level.

The first latch circuit 110 stores data applied externally through Y-pass gate circuit 40 until a programming cycle is completed. The latch circuit 110 includes NMOS transistors M24 and M25 and inverters IV8 and IV9, which form latch 112. NMOS transistor M24 is connected between node N5 of latch 112 and Y-pass gate circuit 40, transferring data to be programmed supplied through Y-pass gate circuit 40 to latch 112 in response to signal SPB for the programming cycle. NMOS transistor M25, the gate of which is coupled to signal PBset, is connected between node N6 (the complimentary node of node N5 of latch 112) and ground Vss so as to allow node N5 be charged up to Vcc in response to signal PBset. The input of inverter IV8 and output of inverter IV9 are connected to node N6 and the drain of NMOS transistor M25. The input of inverter IV9 and the output of inverter IV8 are connected to node N5, in common with the source of NMOS transistor M24.

The second latch circuit 120 has inverting circuit 122 and tri-state inverter IV7. Inverting circuit 122 includes PMOS transistors M19 and M20 and NMOS transistors M21 through M23. The gate of PMOS transistor M19, the source of which is connected to Vcc, is connected to a corresponding bit line through the transistor M17, controlled by signal BLSHF. The source of PMOS transistor M23, whose gate is coupled to node N5 of latch 112, is connected to the node N4 through NMOS transistor M21 and tri-state inverter IV7, controlled by signals Osac and nOsac. NMOS transistor M21, the gate of which is coupled to signal CTL1, is connected between the drain of NMOS transistor M22 and node N7, which is connected to the source of M19 through PMOS transistor M20. The gate of PMOS transistor M20 is coupled to node N5 together with the gate of NMOS transistor M23, which is connected between the source of NMOS transistor M21 and ground, with NMOS transistor M22 in parallel.

Figure 1:
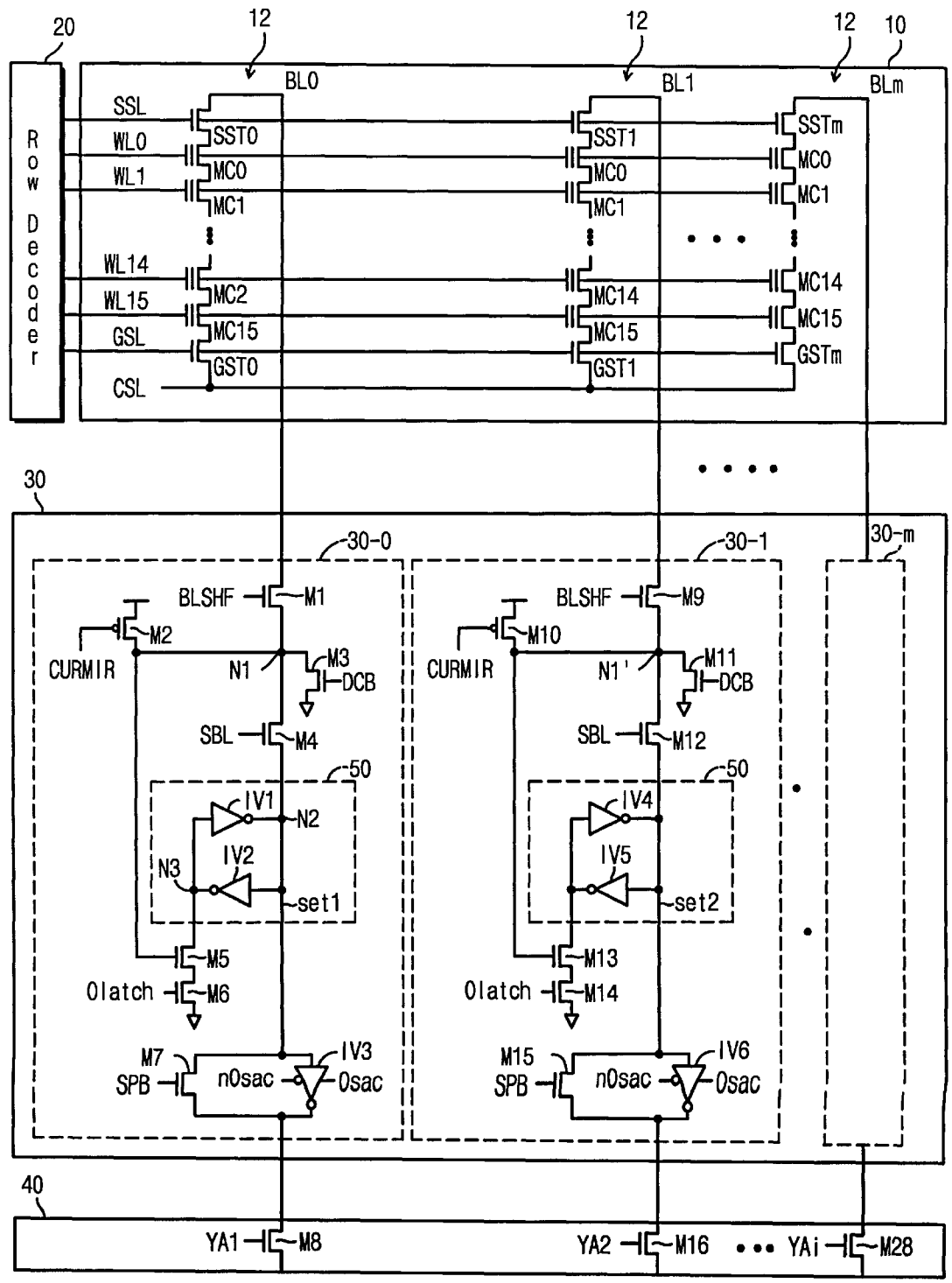
FIG. 1 contains a block diagram illustrating a cell array and page buffers in a conventional NAND-type flash memory.
Figure 2:
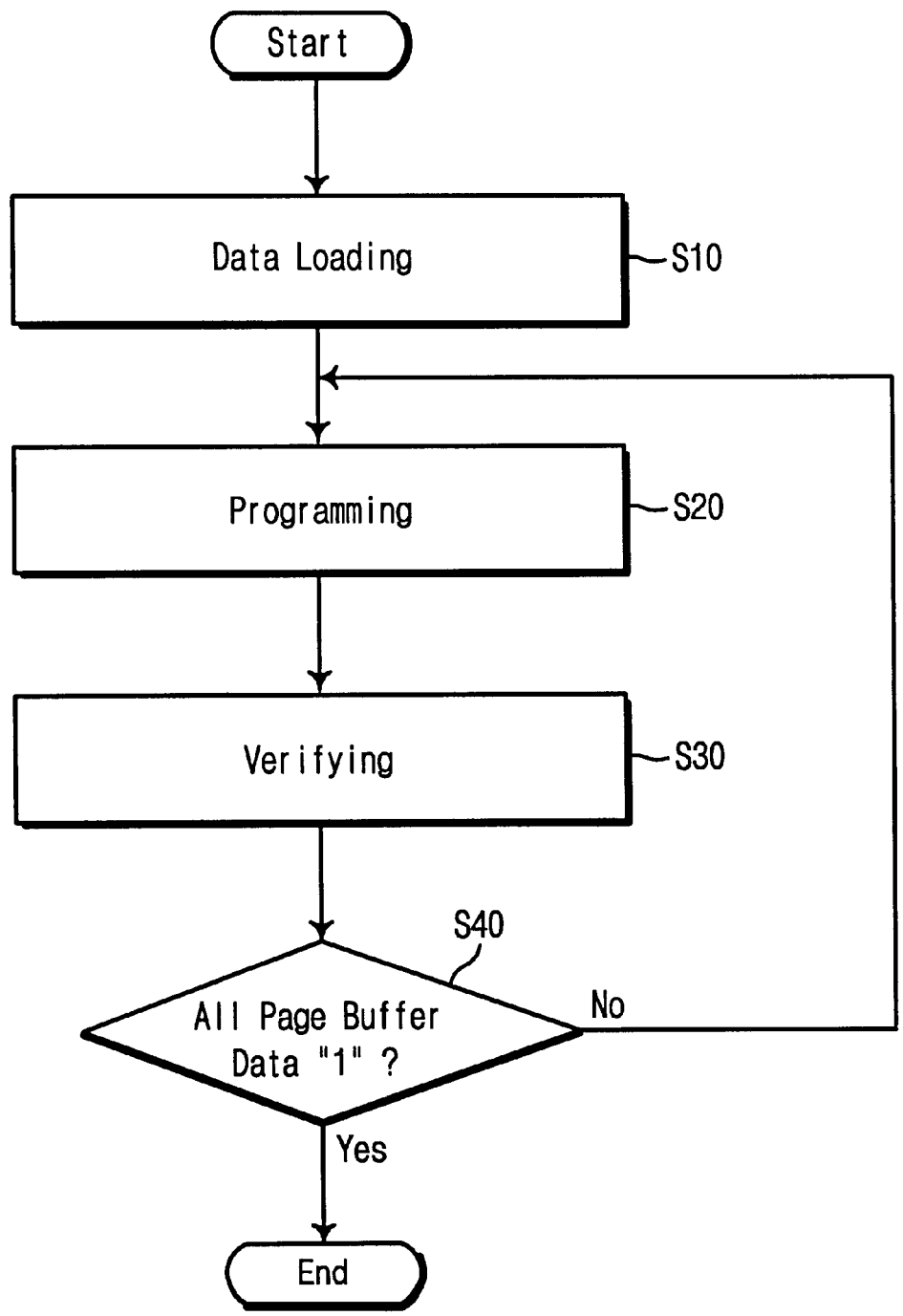
FIG. 2 is a flow chart illustrating the logical flow of a programming operation in a memory.
Figure 3:
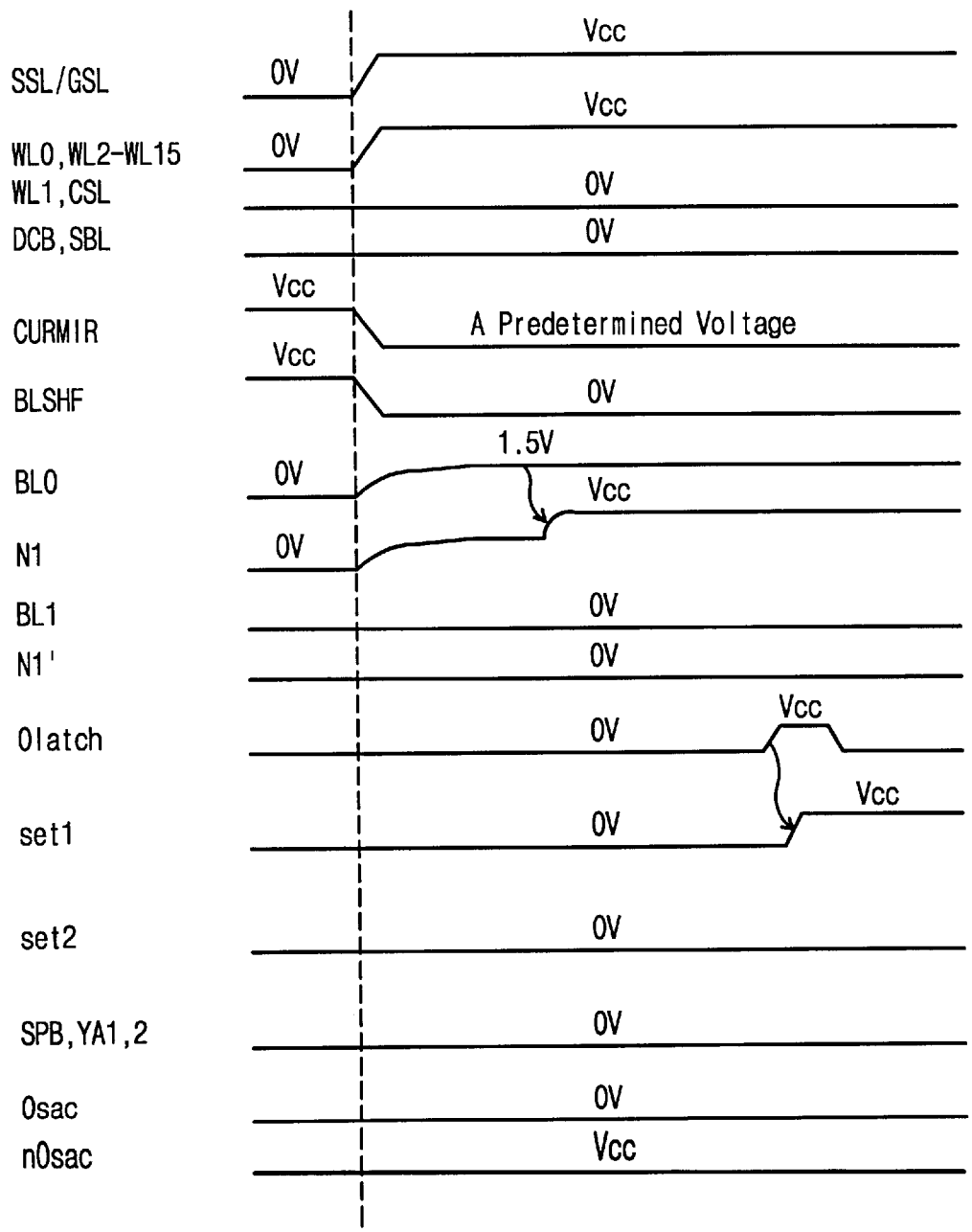
FIG. 3 contains a timing diagram for signals controlling the page buffers shown in FIG. 1 during a program verifying cycle.
Figure 4:
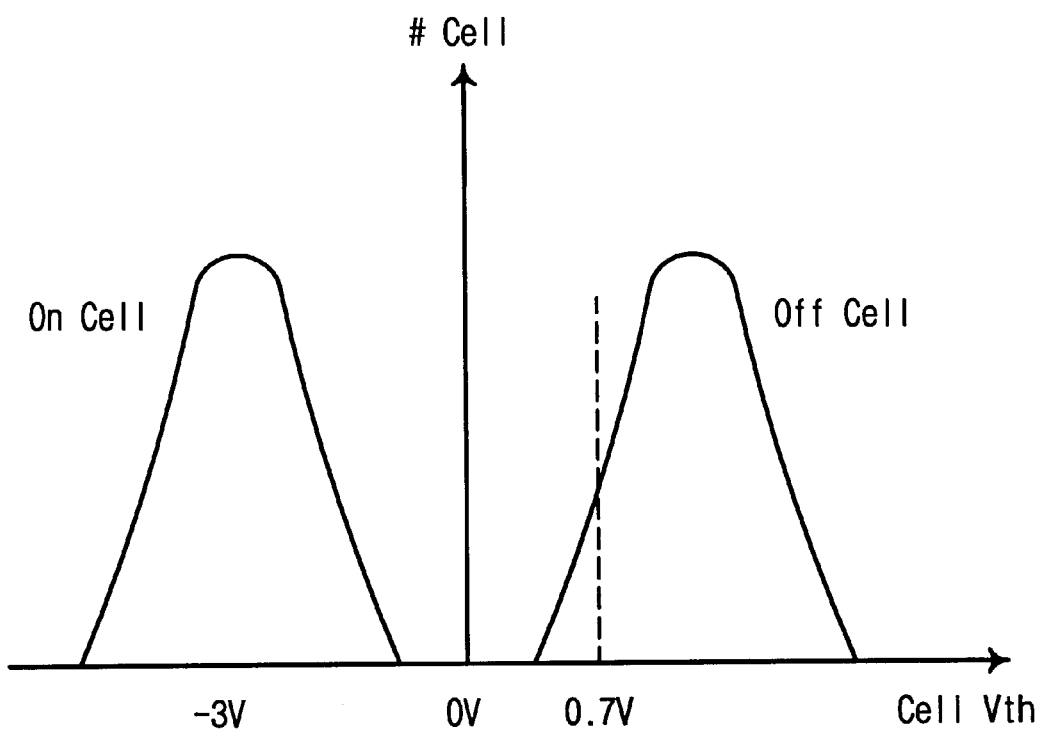
FIG. 4 shows distribution profiles for threshold voltages of a memory cell transistor after the verifying cycle of FIG. 3.
Figure 6:
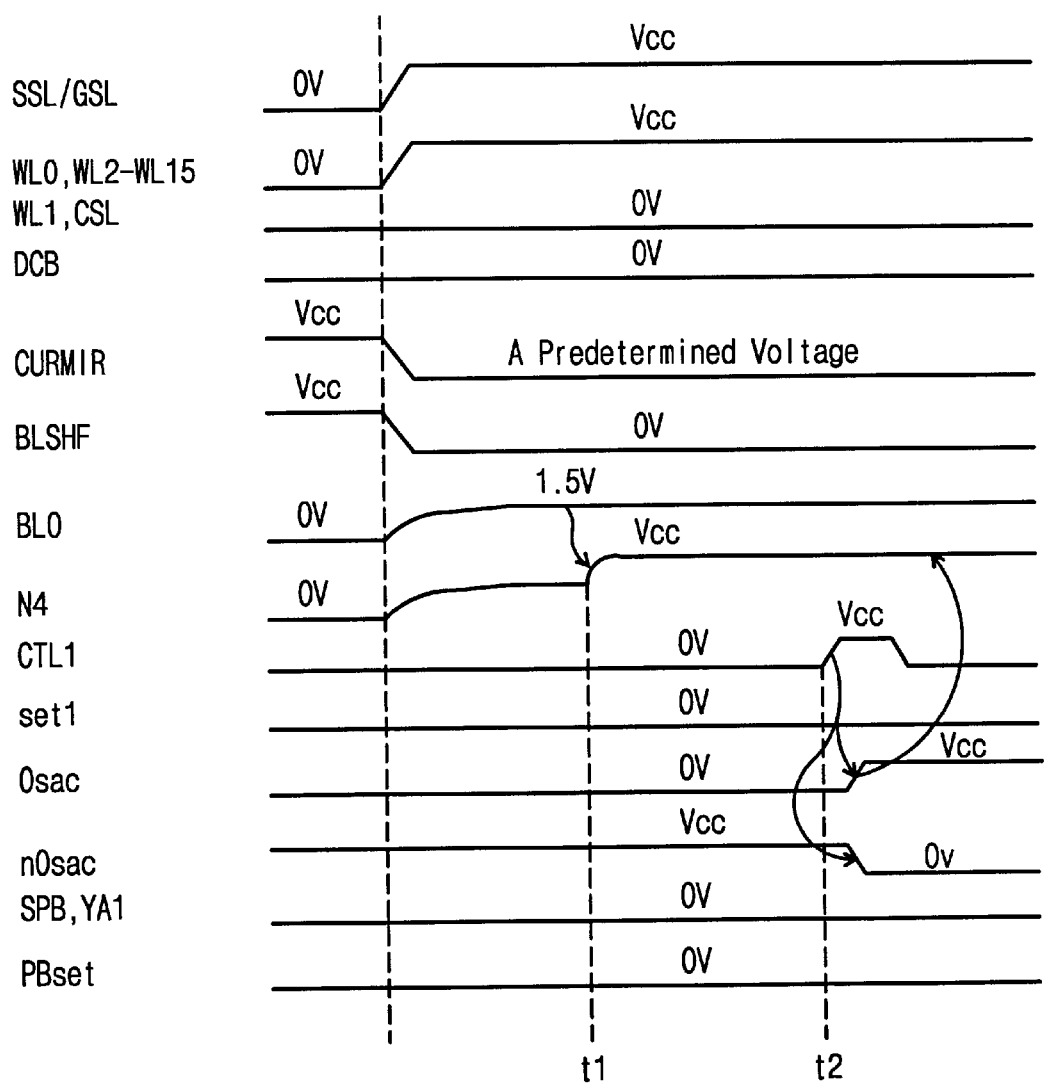
FIG. 6 contains a schematic timing diagram of signals controlling the page buffers shown in FIG. 5 during a program verifying cycle, according to the invention.
Figure 7:
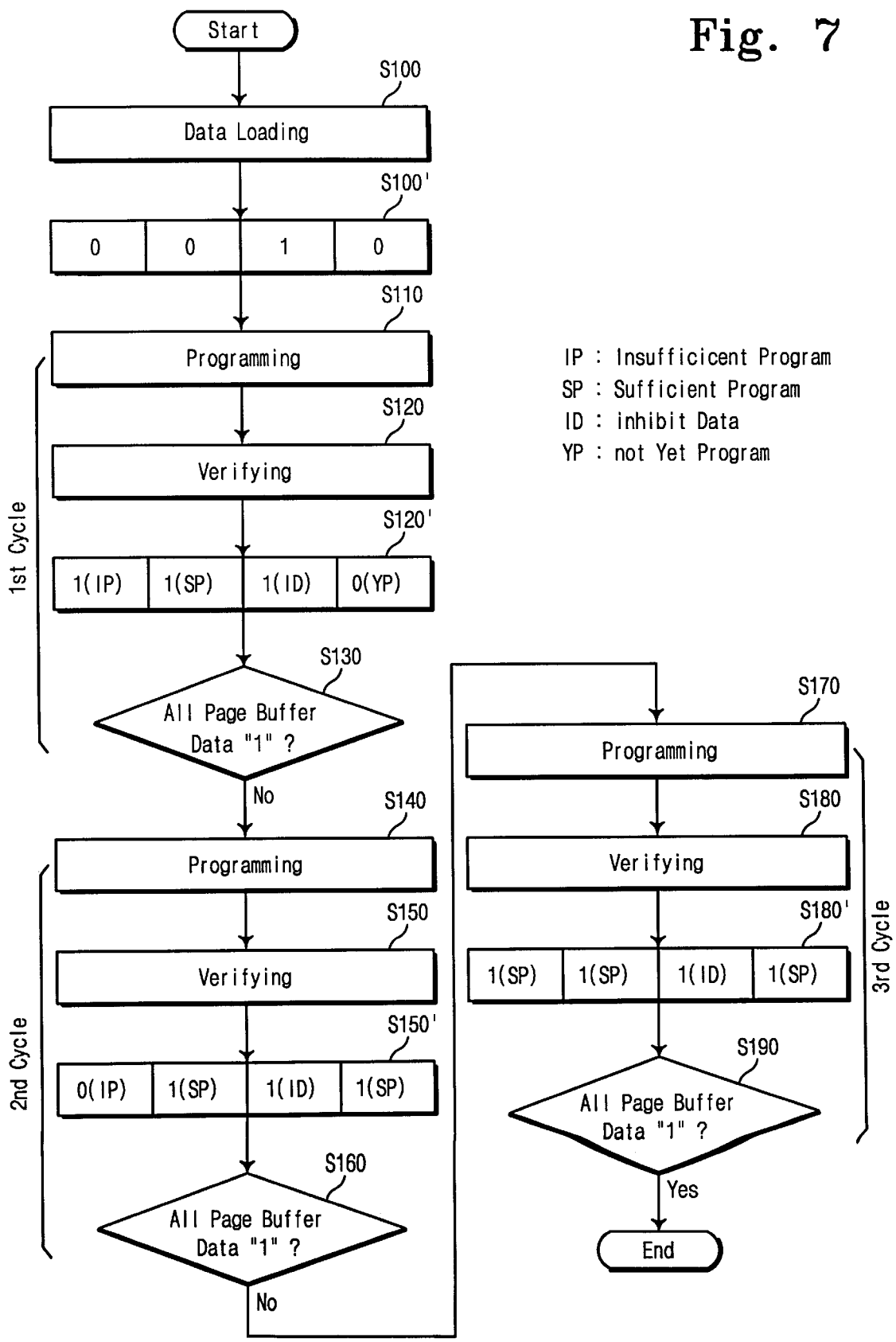
FIG. 7 contains a flow chart illustrating the logical flow of a program verifying function in a programming cycle, according to the invention.
Figure 8:
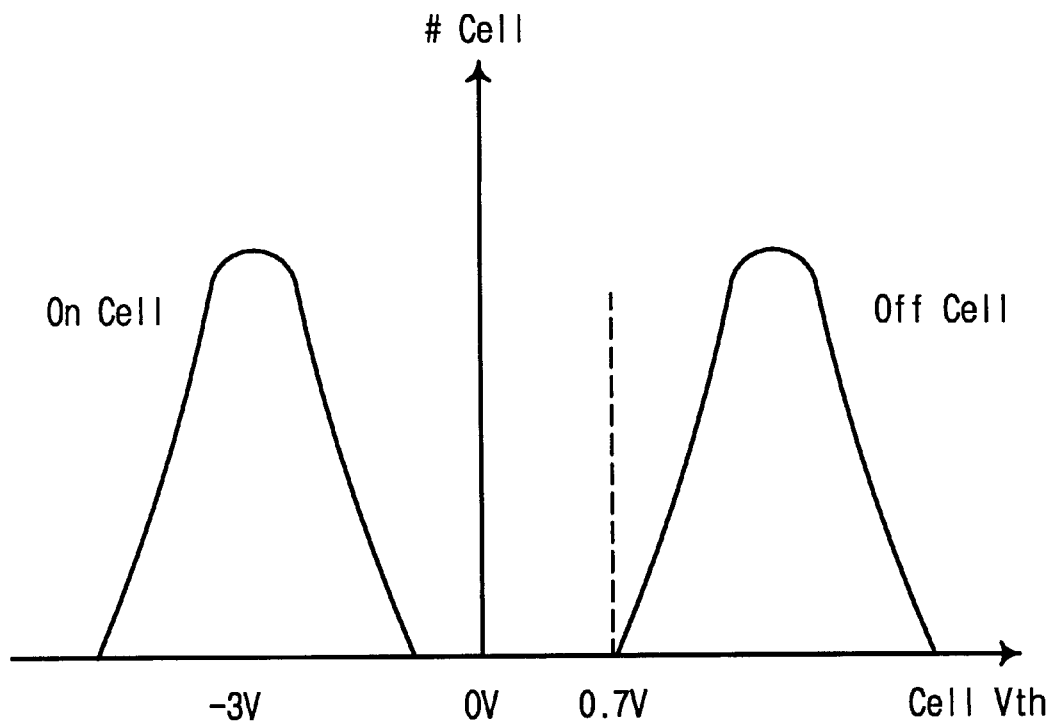
FIG. 8 shows distribution profiles for threshold voltages of a memory cell transistor after performance of the verifying function shown in FIG. 7.

One embodiment of the programming operation in the memory of FIG. 5 in accordance with the invention will now be described with reference to FIGS. 6–8. FIG. 6 is a timing diagram illustrating the timing of signals used to implement the operation. FIG. 7 contains a flow chart illustrating the logical flow of the operation. FIG. 8 contains distribution profiles for threshold voltages for memory cells in connection with the operation. First, assuming that data has been latched in the first latch circuit 110 at step S10 shown in FIG. 2, the subsequent steps, including S20 and S30, carry out the programming cycles for a memory cell, e.g., MC0, associated with the first latch circuit 110. At this time, as above mentioned, it could occur that the under-programmed memory cell MC0, which has a threshold voltage of about 0.3 V, is regarded as an off-cell through the step S40 due to the CSL noise which has been increased to about 0.7 V while recycling the verifying step S30. Then, as shown in FIG. 6, the voltage level of bit line BL0 coupled to the under-programmed cell MC0 is pulled up to about 1.5 V and thereby node N4 goes to Vcc. NMOS transistor M22 in the second latch circuit 120 is turned on and PMOS transistor M20 is turned on by the data "0" that has been stored in the first latch circuit 110. Thereafter, as signal CTL1 rises up to Vcc, node N4 is set to the level of Vcc by activations of NMOS transistors M21 and M22 and tri-state inverter IV7.

Since the amount of the CSL noise becomes smaller in accordance with an increase of the number of programmed cells in subsequent programming cycles, the under-programmed cell MC0 is detected as an on-cell not to be programmed completely, and the voltage level on bit line BL0 falls to ground Vss. Node N4 goes to ground from Vcc, and the second latch circuit sets the voltage level at node N4 to ground voltage level in response to the data "0" stored in the first latch circuit 110. Thus, the under-programmed cell MC0 is completely programmed thereby having its proper threshold voltage of about 1 V through the repeated programming operations. During the programming cycles, the first latch circuit 110 is forced to store the initial data "0" that is initially applied thereto, and the second latch circuit 120 senses a present status of data written in the selected memory cell MC0, under the transconductive control involved in the storage condition of the first latch circuit 110.

FIG. 7 shows the flow associated with the programming operation using the latch circuits. Referring to FIG. 7, at step S100, data to be written to a selected memory cell is loaded in the first latch circuits 110 of page buffers 100 assigned to the selected memory cells. Step S100' shows, as an example, that the first latch circuits 110 each hold their external data received. In this case, four items of data, "0", "0", "1" and "0" are stored. Memory cells assigned to the first latch circuits having data "0" are to be programmed while one assigned to the first latch circuit storing data "1" is not. Programming and verifying are performed in steps S110 and S120. As an example, it is assumed that the second latch circuits 120 of the page buffers corresponding to the memory cell selected for programming are in the storage conditions as shown at step S120', in which, from left, the first one has been insufficiently programmed (denoted IP), the second one has been sufficiently programmed (SP), the fourth one has not been programmed yet (YP), and the third cell is regarded as an insufficiently programmed cell, even though it is it is not to be programmed therein. It should be noted that, referring to FIG. 6, for conducting the verifying step S120, string selection line SSL, ground selection line GSL and unselected word lines, e.g., WL0 and WL2–WL15, retain the voltage levels of Vcc or more than Vcc. The selected word line WL1 is held at 0 V; signal BLSHF is at about 2.2 V; signals CTL1 (this goes to Vcc at time t1 shown in FIG. 6), SPB and DCB are all set to 0 V; and signal CURMIR is set at a predetermined voltage level sufficient to turn PMOS transistor M18 on. Under such bias conditions of the control signals, the bit line BL0 coupled to a memory cell, e.g., MC1 being selected but not to be programmed, is pulled up to about 1.5 V, and thereby node N4 goes to Vcc at time t1. Once signal CTL1 rises up to Vcc, signals Osac and nOsac are enabled with Vcc and 0 V, respectively. Thus, PMOS transistor M20, whose gate is coupled to node N5 of the first latch circuit 110, NMOS transistor M22, whose gate is coupled to node N4, and NMOS transistor M21 corresponding to signal CTL1 are all switched on. As a result, the node N4 is set to the level of Vcc by tri-state inverter IV7 controlled by the signals Osac and nOsac, those being set to the voltage levels of Vcc and 0 V, respectively. By those operation for the page buffer assigned to the under-programmed cell which has been detected as an insufficiently programmed cell in step S130 even though that is not to be programmed, is settled in a state of program-prohibiting.

Next, the memory cell which has been determined to be an insufficiently programmed cell at the determining step S130, even though that is designated not to be programmed, can be sensed as a program-prohibited cell (or an inhibit data cell; ID), i.e., an on-cell, at the following determining step S150' after the subsequent programming and verifying steps, S140 and S150. This is because the voltage of bit line BL0 assigned to the cell wrongly detected as an off-cell and not to be programmed has been discharged to ground by the high potential of node N4 being set to the level of Vcc. After the step S150', programming and verifying thereof are performed without the malfunctions for the memory cell not to be programmed, through steps S160, S170, S180, S180' and S190. It can be seen that, finally at step S180', all of the memory cells which are designated to be programmed are sensed as off-cells (or sufficiently programmed cells) and the cell not to be preprogrammed is still put into the state with inhibit data (or the program-prohibited), and resultant profiles of threshold voltage corresponding to the selected memory cells to be programmed or not to be programmed are shown in FIG. 8.

As described above, the memory according to the invention provides advanced programming and verifying functions such that a memory cell to be designated not to be programmed is prevented from being regarded as an insufficiently programmed cell together with other memory cells designated to be programmed, thus reducing the amount of current involved in a cell array during the entire programming operation and enhancing the reliability of data stored in memory cells after programming.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A semiconductor memory comprising:

a plurality of electrically programmable memory cells coupled to word lines and bit lines of the semiconductor memory;

a first latch circuit coupled to said bit lines, for holding data during a programming operation and during a programming verification operation; and a second latch circuit coupled to said first latch circuit for generating, in response to the data held in the first latch circuit, a result from verifying a programmed memory cell.

2. The memory of claim 1 wherein the first and second latch circuits are part of a page buffer circuit of the memory.

3. The memory of claim 1 wherein the first latch circuit comprises a pair of inverter circuits.

4. The memory of claim 1 wherein the second latch circuit comprises a pair of inverter circuits.

5. A semiconductor memory comprising:

a plurality of electrically programmable memory cells coupled to word lines and bit lines of the semiconductor memory;

means for loading data from an outside of the memory;

means for programming the memory cells;

means for verifying programmed cells;

means, coupled to said bit lines, for holding the data during a programming operation and a programming verifying operation; and means, coupled to said holding means, for generating a result, in response to the data held in the holding means, from verifying a programmed memory cell.

6. The memory of claim 5 wherein said means for holding and said means for generating are part of a page buffer circuit of the memory.

7. The memory of claim 5 wherein said means for holding comprises a pair of inverter circuits.

8. The memory of claim 5 wherein said means for generating comprises a pair of inverter circuits.

* * * * *